(12) United States Patent
Smart

(10) Patent No.: US 6,337,462 B1
(45) Date of Patent: Jan. 8, 2002

(54) LASER PROCESSING

(75) Inventor: Donald V. Smart, Boston, MA (US)

(73) Assignee: General Scanning, Inc., Watertown, MA (US)

( * ) Notice: Subject to any disclaimer, the term of this patent is extended or adjusted under 35 U.S.C. 154(b) by 0 days.

(21) Appl. No.: 09/441,201

(22) Filed: Nov. 16, 1999

Related U.S. Application Data

(63) Continuation of application No. 08/774,107, filed on Dec. 24, 1996, now Pat. No. 5,998,759.

(51) Int. Cl.[7] .............................................. B23K 26/36
(52) U.S. Cl. ............................. 219/121.68; 219/121.69
(58) Field of Search ..................... 219/121.6, 121.61, 219/121.68, 121.69, 121.73, 121.75, 121.77, 121.85; 216/65; 438/601, 940; 29/847

(56) References Cited

U.S. PATENT DOCUMENTS

| | | |
|---|---|---|
| 3,740,523 A | 6/1973 | Cohen |
| 4,399,345 A | 8/1983 | Lapman et al. |
| 4,483,005 A | 11/1984 | Smart |
| 4,847,850 A * | 7/1989 | Kafka et al. .................. 372/71 |
| 5,021,362 A | 6/1991 | Chlipala |
| 5,059,764 A | 10/1991 | Bear |
| 5,066,291 A | 11/1991 | Stewart |
| 5,128,061 A | 7/1992 | Orbach et al. |
| 5,163,062 A * | 11/1992 | Moberg ........................ 372/29 |
| RE34,192 E | 3/1993 | Bear |
| 5,208,437 A | 5/1993 | Miyauchi et al. |
| 5,265,114 A | 11/1993 | Sun et al. |
| 5,293,025 A | 3/1994 | Wang |
| 5,473,624 A | 12/1995 | Sun |
| 5,521,932 A * | 5/1996 | Marshall ...................... 372/36 |
| 5,569,398 A | 10/1996 | Sun |
| 5,611,946 A | 3/1997 | Leong et al. |
| 5,685,995 A | 11/1997 | Sun et al. |
| 5,696,778 A * | 12/1997 | MacPherson .................. 372/4 |

FOREIGN PATENT DOCUMENTS

| | | |
|---|---|---|
| JP | 5-104266 | 4/1993 |
| WO | WO 94/06182 | 3/1994 |
| WO | WO 96/12830 | 5/1996 |
| WO | WO 96/15870 | 5/1996 |

OTHER PUBLICATIONS

Cook, P.W. et al.; "Connections and Disconnections on Integrated Circuits Using Nanosecond Laser Pulses"; Appl. Phys. Lett., vol. 26, No. 3; pp. 124–126; Feb. 1, 1975.

(List continued on next page.)

Primary Examiner—Samuel M. Heinrich
(74) Attorney, Agent, or Firm—Fish & Richardson, PC

(57) ABSTRACT

A controlled, switched laser system for vaporizing a target structure on a substrate includes a diode-pumped, solid-state laser for producing a laser output, a controllable switch for controlling the on/off state and power level of the laser, and a wavelength shifter. The wavelength shifter shifts the wavelength of the laser output from a conventional wavelength to a wavelength beyond the absorption edge of the substrate but shorter than 1.2 $\mu$m in order to obtain a decrease in absorption of the laser output by the substrate due to the shift in the wavelength of the laser output. The wavelength shifter is removably insertable into the switched laser system so as to enable the switched laser system to operate at the conventional wavelength and at the wavelength beyond the absorption edge of the substrate. Heating of the substrate and hence damage to the substrate is limited due to the wavelength being beyond the absorption edge of the substrate. Good depth of focus of the laser beam output is maintained relative to spot size of the laser beam output due to the wavelength being less than about 1.2 $\mu$m.

26 Claims, 14 Drawing Sheets

OTHER PUBLICATIONS

Faber, Jr, Marshall; "Algorithmic Trimming on Active Circuitry"; Proceedings of the Electronic Components Conference, Washington DC; pp. 248–254, 1974.

General Scanning Inc., Laser Systems Division; "M325 Memory Repair System" brochure; 32 Cobble Hill Road, Somerville, Massachusetts.

Gillespie, D.T. et al.; "Transmittance of Optical Materials at High Temperature in the 1-$\mu$ to 12-$\mu$ Range"; Applied Optics; vol. 4, No. 11; pp. 1488–1493; 1965.

Hutchens; "New Laser Technology Addresses the Yield Enhancement Challenge of the Evolving Generation of Memory Devices"; Electro Scientific Industries, Inc.; Portland OR 97229 USA; 1993.

Hurtig III, et al.; "An Overview of Laser Functional Trimming Techniques"; Proceedings of the Electronic Components Conference, Washington, DC; pp. 240–244; 1974.

Kestenbaum et al.; "Photoexcitation Effects During Laser Trimming of Thin–Film Resistors on Silicon"; IEEE Transactions on Components, Hybrids, and Manufacturing Technology; vol. CHMT–3 No. 1; 1980.

Kestenbaum, Ami; "Semiconductor Processing Applications With Lasers"; Proceedings of the Technical Program, Int'l. Microelectronics Conference, Anaheim CA; pp. 235–244; Feb. 23, 1982.

Laser Report; "ESI Debuts 1.3–Micron Chip–Repair System"; Jul. 1, 1996.

Litwin et al; "Laser Adjustment of Linear Monolithic Circuits"; Technical Digest of Int'l. Congress on Applications of Lasers and Electro–Optics, L.I.A; p. 32; Nov. 14–17, 1983.

Litwin et al.; "Laser Adjustment of Linear Monolithic Circuits"; Laser Institute of America, International Congress on Applications of Lasers and Electro–Optics; vol. 38, pp. 166–173; 1983.

Murray et al.; "Generation of 1.5–$\mu$m Radiation Through Interactivity Solid–State Raman Shifting in Ba(NO$_3$)$_2$ Nonlinear Crystals"; Optics Letters; vol. 20, No. 9; pp. 1017–1019; 1995.

James C. North et al.; "Laser Coding of Bipolar Read–Only Memories"; IEEE Journal of Solid–State Circuits; pp. 500–505; Aug. 1976.

James C. North et al.; "Laser Vaporization of Metal Films—Effect of Optical Interference in Underlying Dielectric Layers"; Journal of Applied Physics; vol. 48, No. 5; pp. 2419–2423; Jun. 1977.

Price et al.; "A passive Laser–Trimming Technique to Improve the Linearity of a 10–Bit D/A Converter"; IEEE Journal of Solid–State Circuits; vol. SC–11, No. 6; pp. 784–794; Dec. 1976.

Runyan, W.R.; *Silicon Semiconductor Technology*; Texas Instruments Electronics Series; Chapter 9; p. 187; McGraw Hill, New York; 1965.

Scarfone, et al.; Computer Simulation of Target Link Explosion in Laser Programmable Redundancy for Silicon Memory; J Mater. Res.; vol. 1, No. 2; pp. 367–381; Mar./Apr., 1986.

Shui et al.; "Effect of Vapor Plasma on the Coupling of Laser Radiation with Aluminum Targets"; J. Quant. Spectrosc. Radiat. Transfer; vol. 20, pp. 627–636; 1978.

Donald V. Smart; "Considerations of Laser Material Interactions for the Trimming of Thin Film Resistors"; IEEE Int'l. Symp. on Circuits and Systems Proceedings, Montreal, Canada; May 7, 1984.

Donald V. Smart; "Implementing Memory Redundancy: Laser Beam Alignment Targets"; Teradyne Application Report 149B; pp. 1–8.

Donald V. Smart et al.; Laser Processing for Application Specific Integrated Circuits (ASICs); SPIE vol. 774 Lasers in Microlithography; pp. 88–92; 1987.

Donald V. Smart; "Optimization of Semiconductor Layer Thicknesses for Repair of RAMs"; Teradyne Application Report 150; pp. 1–11.

Donald V. Smart; "System Considerations for the Laser Repair of Semiconductor Memories"; Technical Digest of the Conference on Lasers and Electro–Optics; Balt., MD; May 17–20, 1983.

Harris Sun et al.; "Optimization of Memory Redundancy Laser Link Processing"; SPIE; vol. 2636; Jun. 1995.

Wells et al.; "A Technique for Automatic Focusing and Alignment of Monolithic Circuits for Laser Trimming"; Proceedings of the Third Annual Microelectronic Measurement Technology Seminar; Mar. 1981.

* cited by examiner

| MATERIAL | STIMULATED CROSS SECTION | FLUORESCENT LIFETIME | ISAT | SINGLE PASS GAIN |
|---|---|---|---|---|
| YAG (1.064 um) | $6 \times 10^{-17}$ | 230 uSEC | 14 WATTS/mm$^2$ | 21% |
| YAG (1.32 um) | $1.25 \times 10^{-17}$ | 230 uSEC | 52 WATTS/mm$^2$ | 6% |
| YLF (1.047 um) | $4.0 \times 10^{-17}$ | 470 uSEC | 10 WATTS/mm$^2$ | 29% |
| YLF 1.32 um | $0.8 \times 10^{-17}$ | 470 uSEC | 40 WATTS/mm$^2$ | 7% |
| Nd:VO4 (1.064 um) | $15.6 \times 10^{-17}$ | 90 uSEC | 13.5 WATTS/mm$^2$ | 21% |
| Nd:VO4 (1.34 um) | $6 \times 10^{-17}$ | 90 uSEC | 28 WATTS/mm$^2$ | 10% |
| | | | | |

FIG. 10

| MATERIAL / WAVELENGTH | OPTIMUM OUTPUT COUPLER |
|---|---|
| YAG / 1.064 MICRONS | 6% |
| YAG / 1.32 MICRONS | 3% |
| YLF / 1.047 MICRONS | 7.5% |
| YLF / 1.32 MICRONS | 3% |
| YVO4 / 1.064 MICRONS | 6% |
| YVO4 / 1.34 MICRONS | 4% |

FIG. 11

| MATERIAL / WAVELENGTH | MINIMUM PULSE WIDTH |
|---|---|
| YAG / 1.064 MICRONS | 5.2 NANOSECONDS |
| YAG / 1.32 MICRONS | 14 NANOSECONDS |
| YLF / 1.047 MICRONS | 4.7 NANOSECONDS |
| YLF / 1.32 MICRONS | 14 NANOSECONDS |
| YVO4 / 1.064 MICRONS | 3.4 NANOSECONDS |
| YVO4 / 1.34 MICRONS | 10.3 NANOSECONDS |

FIG. 12

LASER PROCESSING

This application is a continuation (and claims the benefit of priority under 356 USC 120) of U.S. application Ser. No. 08/774,107, filed Dec. 24, 1996, now U.S. Pat. No. 5,998, 759. The disclosure of the prior application is considered part of (and is incorporated by reference in) the disclosure of this application.

BACKGROUND OF THE INVENTION

This invention relates to employing a laser beam to vaporize or otherwise alter a portion of a circuit element on a silicon substrate and is particularly applicable to vaporizing metal, polysilicide and polysilicon links for memory repair.

Semiconductor devices such as memories typically have conductive links adhered to a transparent insulator layer such as silicon oxide, which is supported by the main silicon substrate. During laser processing of such semiconductor devices, while the beam is incident on the link or circuit element, some of the energy also reaches the substrate. Depending upon the power of the beam, length of time of application of the beam, and other operating parameters, the silicon substrate can be overheated and damaged.

Laser processes of this kind have typically been conducted at wavelengths of 1.047 $\mu$m or 1.064 $\mu$m. Silicon has sufficiently low absorption at these wavelengths that the amount of beam energy employed to evaporate typical polysilicide and polysilicon links has not harmed the underlying silicon substrate.

It has been recognized, e.g., by the present inventor, by Lapham et al. in U.S. Pat. No. 4,399,345, and by others, that in laser processing of semiconductor devices, it can be advantageous to use wavelengths beyond the "absorption edge" of silicon (i.e., wavelengths greater than about 1.1 $\mu$m, where the absorption of silicon drops precipitously). This makes the silicon substrate more transparent to the laser beam, and reduces heating of the silicon caused by absorption of the beam. The preferred wavelength generally mentioned for this purpose has been 1.32 or 1.34 $\mu$m, though a broad theoretical range of low absorption has been identified. The 1.32 or 1.34 $\mu$m wavelength has been proposed as it is close to the minimum absorption of silicon.

Removal of memory links for memory repair is an application in which these considerations are relevant. As noted in "Computer simulation of target link explosion in laser programmable redundancy for silicon memory" by L. M. Scarfone and J. D. Chlipala, 1986, p. 371, "It is desirable that laser wavelengths and various material thicknesses be selected to enhance the absorption for the link removal process and reduce it elsewhere to prevent damage to the remainder of the structure."

The usefulness, in general, of thicker insulative layers underneath links or circuit elements, and the usefulness of limiting the duration of heating pulses has also been recognized, as in the paper of which I was author, "Laser Adjustment of Linear Monolithic Circuits", Litwin and Smart, 166/L.I.A., Vol. 38 ILAELO (1983).

Makers of semiconductor devices typically continue production of earlier developed products while developing and entering production of more advanced versions that typically employ different structures and processes. Many current memory products employ polysilicide or polysilicon links while smaller link structures of metal are used for more advanced products such as the 256 megabit memories. Links of 1 micron width, and ⅓ micron depth, lying upon a thin silicon oxide layer of 0.3 to 0.5 microns are being used in such large memories. Production facilities typically have lasers and related equipment capable of operating at the conventional wavelengths of 1.047 $\mu$m or 1.064 $\mu$m and also wish to have lasers and related equipment capable of operating in the wavelength region recognized for its lower absorption by silicon.

SUMMARY OF THE INVENTION

I have realized that, while taking advantage of the lower absorption of silicon at a wavelength beyond the absorption edge of about 1.1 $\mu$m, and by tightly constraining the duration of the laser pulse in which energy is delivered, it is possible in many instances to obtain an improved overall result in throughput of successful repair of memory links, e.g. in high density memories, at high repetition rate of the laser pulses. Preferably the pulse duration for imparting sufficient energy to remove the link is constrained to less than 10 nanoseconds, more preferably to less than about 5, and even more preferably to about 4 nanoseconds or less, while using a pulse repetition rate of at least 5 Khz and preferably 8 Khz, 10 Khz or higher.

By so limiting the duration in which the energy required to produce link removal is delivered, temperature rise in the silicon can be limited to prevent damage.

I have realized that, with the very small spot size used with small metal links, the heat may be considered to spread in essentially an exponential gradient by conduction from the portion of the beam striking the target. By employing a peak beam power so high that sufficient energy for evaporation of the link is delivered in a pulse of 8 nanoseconds, and preferably substantially less, the conductive component of heat transfer can be substantially confined to a metal link and the underlying oxide layer, despite its being very thin, such that the temperature rise in the silicon attributable to conduction and the temperature rise attributable to absorption of the beam in silicon, can cumulatively be kept below the temperature threshold at which unacceptable silicon damage occurs.

I have further realized that, to achieve the results with current practical technology, a laser having a wavelength that is not beyond the absorption edge of silicon, capable of high gain at high repetition rate conditions, should be employed to produce an original output beam and a shifting system should be interposed to shift the wavelength of the beam beyond the absorption edge of silicon. Specifically, I have realized that a laser with a high-gain wavelength, e.g. at 1.047 or 1.064 microns, shifted to a longer wavelength beyond the absorption edge, can produce the desired short pulse in which the requisite energy is delivered.

Using a neodymium vanadate laser with a short cavity length, a pulse width of less than 5 nanoseconds can be achieved at repetition rates up to 10 Khz, and of 4 nanoseconds up to about 8 Khz.

By employing a system in which the pulse rate is thus at least 5 Khz, and preferably 8 Khz or 10 Khz, at a wavelength beyond the absorption edge of silicon with a pulse width of less than 8 nanoseconds, and preferably less than 5 nanoseconds or 4 nanoseconds, one can obtain clean removal of a link without leaving conductive residue.

Furthermore, I have realized that by observing an upper limit on the wavelength of less than about 1.2 $\mu$m, the overall process advantage of better focusability gained at such wavelength can outweigh any advantage that could otherwise be obtained by using longer wavelengths at which the absorption of silicon is more minimized. The sharpness of spot size and good depth of focus lead to reliable processing of very large die such as are carried on an 8-inch wafer, which may have significant variation in flatness over the die surface. In particular, many 8-inch wafers are less than about 300 microns thick and suffer a condition sometimes referred to as the "potato chip" effect, in which the surface curves or otherwise is not flat. The smaller spot size and better depth of focus obtainable by maintaining the wavelength less than 1.2 μm can improve the defect rate with such wafers in excess of what might be obtained when longer wavelengths, e.g. 1.32 μm, are employed.

Thus, very clean removal of metal links of current design, e.g. of 1 micron width and ⅓ micron thickness, can be obtained, with high throughput of memory repair and with relatively few rejects.

According to another aspect of the invention, an optical system is employed to accurately focus a laser spot when operating at a wavelength that is not beyond the absorption edge and the same optical system is used, without modification, at a wavelength beyond the absorption edge, constrained less than 1.2 μm. This provides a versatile new laser system that can be inexpensively retrofitted into existing laser systems. For instance, the initial 1.064 μm laser beam output of the system is useful directly for processing conventional polysilicide or polysilicon links, and, with the same optical system, using the constrained wavelength range beyond the silicon absorption edge, but less than 1.2 μm, fine metal links can be processed. Depending upon the work load of the particular production facility the optics of the system are optimized at one or the other of the working wavelengths.

According to another aspect of the invention, a laser with high gain is employed for operating at the conventional wavelength, e.g. of 1.047 μm or 1.064 μm, the laser cavity is constructed of appropriately short length and is otherwise selected to produce the necessary power within a pulse width less than about 8 nanoseconds, and preferably 5 nanoseconds or 4 nanoseconds, at pulse repetition rates of 5 Khz or higher, and a wavelength shifter is removably insertable in the-laser output beam to shift the wavelength to the range beyond the absorption edge but less than 1.2 μm. This system may be selectively employed for different processes at wavelengths above and below the absorption edge of silicon.

In one embodiment of this aspect of the invention, a neodymium vanadate laser is employed having a short cavity length.

For use with the system employing the removable shifter, the optics of the system are optimized for wavelength $\lambda_1$, the wavelength less than the absorption edge, or $\lambda$, the wavelength greater than the absorption edge but less than 1.2 μm, or an intermediate wavelength. In a system where most production is to employ a process at wavelength $\lambda_1$, the optics are optimized for $\lambda_1$, with some slight sacrifice with respect to the longer wavelength $\lambda$. Similarly, where production is mainly at wavelength $\lambda$, the optics are optimized at $\lambda$, with modest degradation for operation at $\lambda_1$. A compromise between those 2 wavelengths at $\lambda_1+\Delta$ can be employed.

While according to certain aspects of the invention, a neodymium vanadate laser is employed to provide a suitably short pulse width, for instance less than 5 or 4 nanoseconds, for repetition rates up to 8 or 10 Khz or above, in certain broader aspects, the invention is not limited to that particular laser or to the other particular features mentioned. In the future it is contemplated that tunable lasers will be useful to the advantage of certain aspects of the present invention.

Numerous other features, objects, and advantages of the invention will become apparent from the following detailed description when read in connection with the accompanying drawings.

BRIEF DESCRIPTION OF THE DRAWINGS

FIG. 10 is a table of stimulated cross section, fluorescent lifetime, $I_{sat}$, and single-pass gain for various laser materials at various wavelengths.

FIG. 11 is a table of optimum output couplers for various laser materials at various wavelengths.

FIG. 12 is a table of minimum pulse widths for various laser materials at various wavelengths.

DETAILED DESCRIPTION

Figure 1:
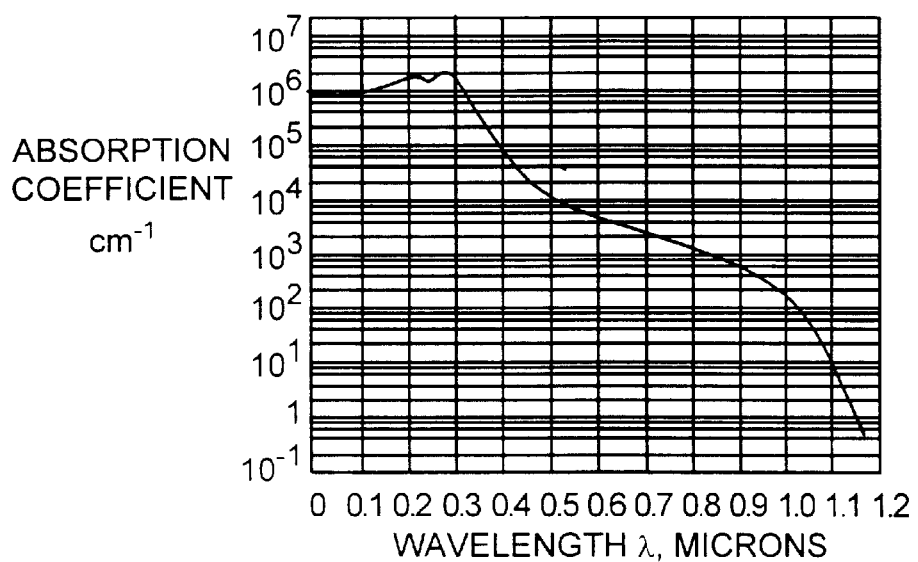
FIGS. 1 and 2 are absorption curves for silicon.

The techniques of the present invention provide quick and reliable removal of links in semiconductor memory devices. By increasing the probability of success of removing individual links, the invention increases the overall probability of successfully repairing a given semiconductor device having many links to be removed, thereby providing successful yields of repaired semiconductor devices.

This is especially important because as the number and density of memory cells in semiconductor devices has increased from 64-kilobit memories to 256-megabit memories, the physical size of the memories has become greater. Although clean rooms have improved, the defect density remains constant for each class of clean room. This means that the number of defects per semiconductor device increases with area. Hence, as the number of storage bits increases, the number of redundant rows and columns of memory also increases. For some 1-megabit memory designs the number of links to support redundant repair is 120, and for 256-megabit memories the number of links has increased to 5000. The number of links required for a 1-gigabit memory may increase to 100,000.

Moreover, the increased probability of success of removing individual links provided by the present invention is particularly valuable because the probability of successfully repairing a semiconductor device varies exponentially with the probability of successfully removing individual links. In particular, if the number of links to support redundancy in a semiconductor device is n and the probability of successfully removing a given link is p, then assuming the removal of each link is an independent event, the probability P of repairing a semiconductor device is:

$$P=p^n.$$

For a 1-megabit memory with 120 links and a probability p of 99.99 percent for removing a single link reliably, the probability P of repairing the entire semiconductor device is 98.8 percent. For a 256-megabit memory with 5000 links to remove, the probability P drops to 61 percent.

The techniques of the present invention also provide a high-gain laser system at high manufacturing throughput. This is especially important because the pulse-to-pulse power stability of laser pulses at high repetition rates (high throughput) can be adversely affected if the gain of the laser system is too low. By providing a high-gain laser system the invention reduces this variation in output and thereby improves the ability of the laser system to successfully remove links at high throughput, which is particularly valuable due to the increasing absolute number of links per semiconductor device (the speed of link removal has increased from 100 links per second up to 10,000 links per second for recent devices). In particular, by maintaining the wavelength of the laser pulses less than 1.2 $\mu$m, the gain of the laser system is improved as compared with operation at 1.32 $\mu$m (as is explained in detail below), thereby improving pulse-to-pulse stability and the overall probability of successfully removing each link.

The improved gain provided by the techniques of the present invention is also important because short laser pulses, which prevent heat from dissipating into the silicon substrate and adjacent structures of a memory device, require a high gain.

Figure 2:
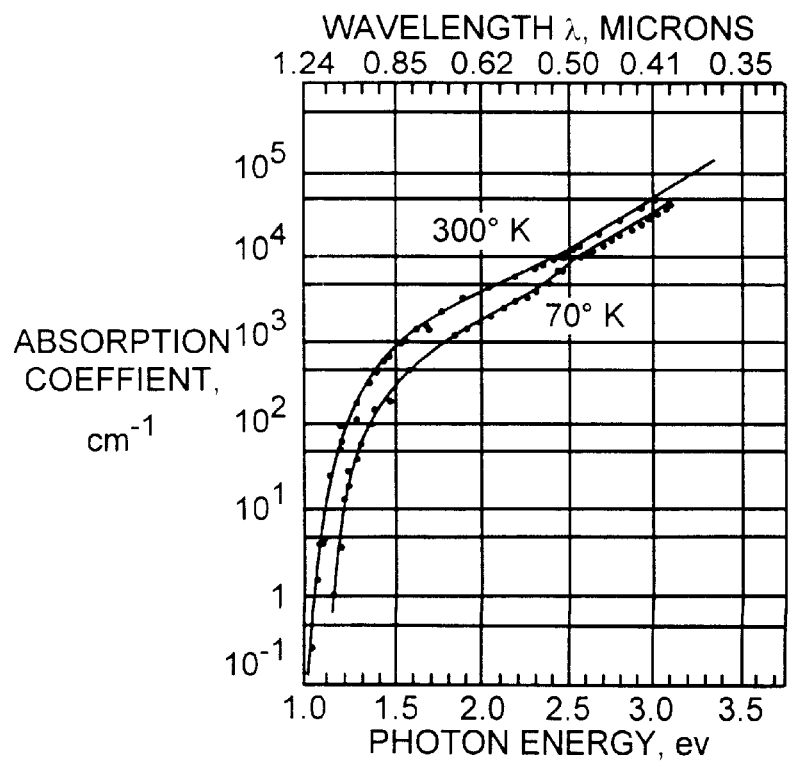

FIGS. 1 and 2 are curves that show the absorption of silicon as a function of wavelength at approximately room temperature. The absorption rapidly drops off after about one micron. The absorption edge is typically about 1.12 microns. At wavelengths greater than 1.12 microns, the silicon starts to transmit more and more easily, and thus it is possible to obtain better part yields upon removing material from the silicon substrate.

Absorption in silicon can be divided into three areas of interest. The first is for wavelengths shorter than those corresponding to the absorption edge ("below the absorption edge"), the second is the transition region near the absorption edge, and the third is for longer wavelengths ("beyond the absorption edge"). For wavelengths below the absorption edge the strong absorption is due to carriers being raised from the valence band to the conduction band. In the long wavelength region the absorption is due to free carriers, crystal lattice vibrations, absorption in impurities, etc., and in this range the absorption is minimal. For the wavelength under consideration, the transition region is of prime interest.

FIGS. 1 and 2 provide detail of the absorption in this transition region. In the range around 1 micron the absorption coefficient decrease by a factor of four orders of magnitude going from 0.9 microns to 1.2 microns. In going from the standard laser wavelength of 1.047 microns to 1.2 microns the curve shows a drop of two orders of magnitude.

To put this into perspective let us examine the absorption in 1 millimeters of silicon based on FIGS. 1 and 2:

$$\text{Absorption}=1-I/I_0=1-\exp(-\alpha x)$$

where x is the thickness of the sample (1 millimeter), I is the energy level at the distance x into the substrate, $I_0$ is the incident energy at the surface of the silicon, and $\alpha$ is the absorption coefficient. The absorption coefficient $\alpha$ is 20 cm$^{-1}$ for 1.047 microns and 0.1 cm$^{-1}$ for 1.2 microns. For these two examples, 86.5 percent of the energy is absorbed in the silicon substrate at 1.047 microns wavelength and 1 percent of the energy is absorbed at 1.2 microns. This shows a drastic change in absorption for a very slight change in wavelength. Thus, operating the laser at a wavelength beyond the absorption edge of the substrate circumvents damage to the substrate, which is especially important if there is a slight mis-alignment of the laser beam with respect to the link.

In certain embodiments of the memory repair system described in detail below, the laser beam output is beyond the absorption edge of silicon but is constrained to less than 1.2 microns, rather than a wavelength that optimizes the transmissivity of silicon. The laser beam output, constrained to less than 1.2 microns, produces a sharply defined spot and good depth of focus for reasons explained below.

Figure 3:
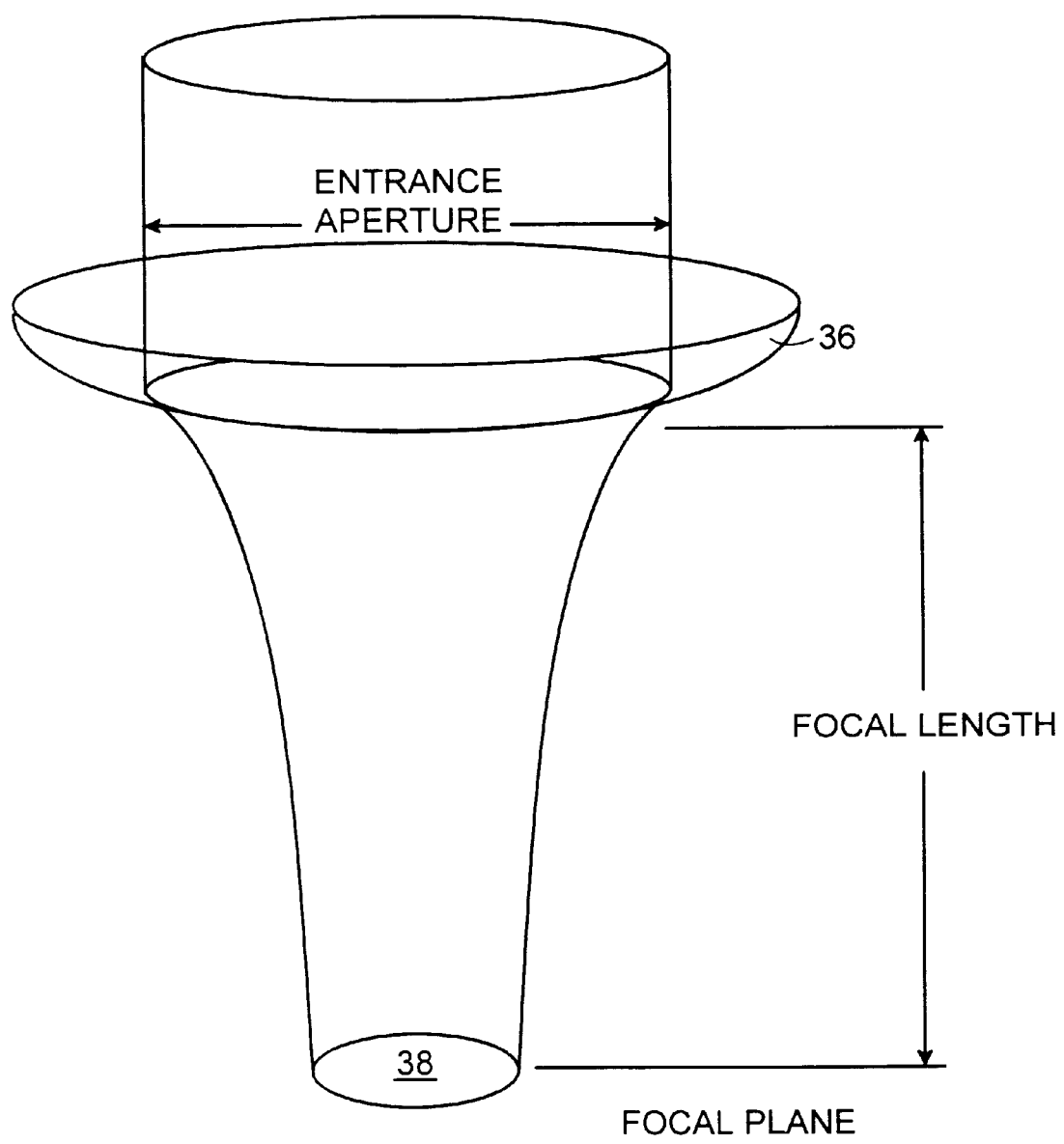
FIG. 3 is a drawing of a laser beam focused onto a small spot on a focal plane.

In particular, with reference to FIG. 3, the ability of a lens 36 to focus to a small spot 38 is dependent upon the wavelength of the laser, the size of the laser beam as it enters the lens, and the focal length of the lens. The spot size at the focus of a lens subsystem is given by:

$$\text{Focused Spot Size} = \frac{K \times \lambda \times (\text{Lens Focal length})}{\text{Entrance Aperture of Lens}} = K \times \lambda \times F\#$$

where $\lambda$ is the laser wavelength and K is a constant dependent upon lens design (typically between 1.83 and 2). As the F# of the lens (the focal length divided by the input beam diameter) becomes smaller, the more difficult it is to design the lens. As the lens approaches an F# of one, extreme care must be taken in lens design. For example, for a wavelength of 1.32 microns, an F# of one, and a lens constant (K) of two, the focused spot size is 2.6 microns. This is very much in the realm of the focused spot size required of memory repair. For a given F# lens, increasing the wavelength from 1.047 microns to 1.198 microns increases the spot size by 14 percent. Increasing the wavelength from 1.047 microns to 1.318 microns increases the spot size by 26 percent. Therefore, it is advantageous to keep the wavelength as short as possible and still have the benefit of the decreased absorption by operating the laser at a wavelength beyond the absorption edge of the substrate.

Another important consideration is the depth of focus, which is defined as the distance over which spot diameter remains reasonably constant. The depth of focus varies inversely to the square of the spot size and inversely to the wavelength of the laser. An empirical formula is given by:

$$\text{Depth of Focus}=(\text{Spot Size})^2/[3 \times (\text{Laser Wavelength})].$$

For a four-micron spot the depth of focus at 1.047 microns is plus or minus five microns. AT 1.32 microns the depth of focus drops to plus or minus four microns. This is a substantial difference.

Figure 4:
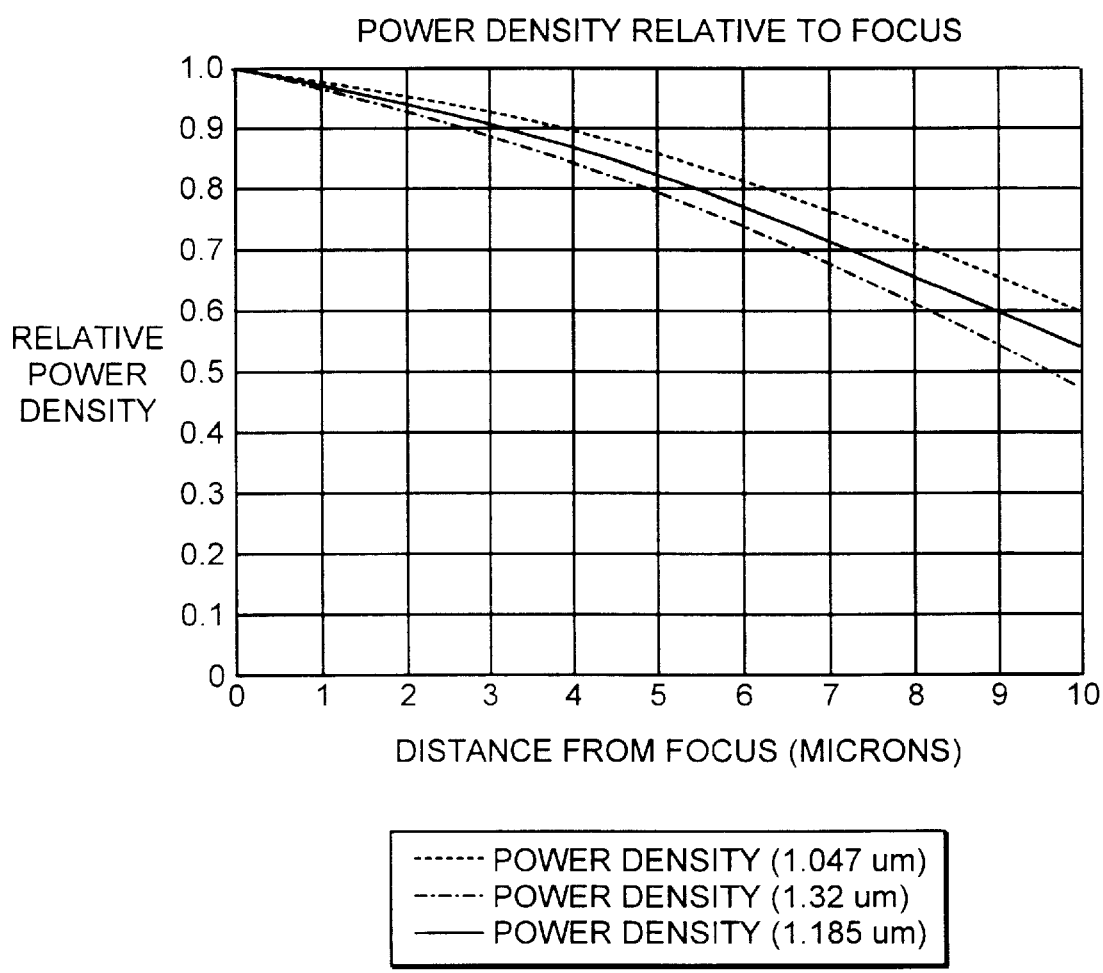
FIG. 4 is a plot of the power density of a laser beam spot on a work piece as a function of the spot's distance from the focus of the laser beam.

The variation of a four-micron spot size as the beam deviates from focus affects the power density on the work piece as shown in FIG. 4.

Figure 5:
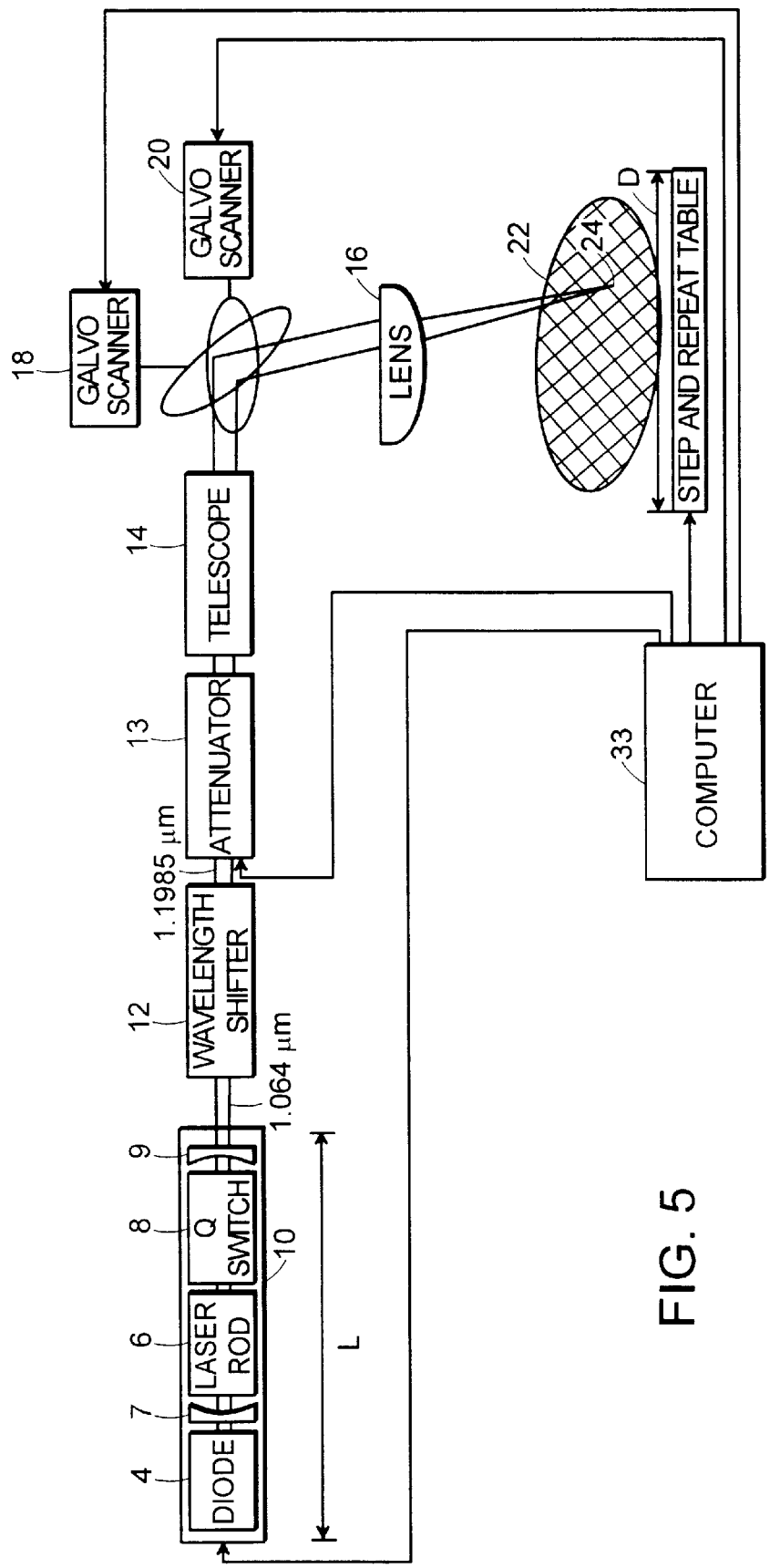
FIG. 5 is a block diagram of a memory repair system that operates at 1.198 μm.

In the block diagram of FIG. 5, a system for removing a link in a memory repair system within a clean room is shown. Laser 10 is constructed to operate at wavelength $\lambda_1$, 1.064 µm, which is less than the absorption edge of silicon. It is aligned to a wavelength shifter 12 that is constructed to shift to a wavelength beyond the absorption edge of silicon. As is explained in more detail below, the beam is then passed through a controlled electroacousto-optic attenuator 13, expanded by a telescope 14, and, at a scanning head 15, is scanned over a focusing lens 16 by two scanner galvanometers, 18 and 20. The spot is focused onto wafer 22 for removing links 24, under control of computer 33.

The laser 10 is mounted on a stable platform 11 relative to the galvanometers and the work piece. It is controlled from outside of the laser itself by computer 33 to transmit its beam to the scanner head comprising the accurate X and Y galvanometers 18 and 20. It is very important, in removing links that the beam be positioned with accuracy of less than 3/10 of a micron. The timing of the laser pulse to correlate with the position of the continually moving galvanometers is important. The system computer 33 asks for a laser pulse on demand.

A step and repeat table 34 moves the wafer into position to treat each memory die.

In one embodiment, the laser 10 is a neodymium vanadate laser, with an overall length L of about 6 inches, and a short cavity length.

The shifter 12 of this preferred embodiment is external to the cavity, and is about another 4 inches long.

The laser is a Q-switched diode pumped laser, of sufficient length and construction to enable external control of pulse rate with high accuracy by computer 33.

The cavity of the laser includes a partially transmissive mirror 7, optimized at $\lambda_1$, which is the wavelength at which the lasing rod 6 of neodymium vanadate is pumped by the diode. The partially transmissive output mirror 9 is also optimized at $\lambda_1$.

The pumping diode 4 produces between about one and two watts depending on the design. It focuses onto the rear of the laser rod 6. As mentioned, the laser rod is coated, on its pumped end, with a mirror 7 appropriate for the standard laser wavelength of 1.064 nm. The other end of the rod is coated with a dichroic coating. Within the laser cavity is an optical Q-switch 8 in the form of an acousto-optic modulator. It is used as the shutter for establishing the operating frequency of the laser. Beyond the Q-switch is the output mirror 9. The two mirrors, 7 on the pumped end of the laser rod and 9 beyond the acoustic optical Q-switch, comprise the laser cavity.

A system optical switch 13 in the form of a further acousto-optic attenuator is positioned beyond the laser cavity, in the laser output beam. Under control of computer 33, it serves both to prevent the beam from reaching the galvanometers except when desired, and, when the beam is desired at the galvanometers, to controllably reduce the power of the laser beam to the desired power level. During vaporization procedures this power level may be as little as 10 percent of the gross laser output, depending upon operating parameters of the system and process. The power level may be about 0.1 percent of the gross laser output during alignment procedures in which the laser output beam is aligned with the target structure prior to a vaporization procedure.

In operation, the positions of the X, Y galvanometers 10 and 12 are controlled by the computer 33 by galvanometer control G. Typically the galvanometers move at constant speed over the memory device on the silicon wafer. The laser is controlled by timing signals based on the timing signals that control the galvanometers. The laser operates at a constant repetition rate and is synchronized to the galvanometers by the system optical switch 13.

In the system block diagram of FIG. 5 the laser beam is shown focused upon the wafer. In the magnified view of FIG. 6, the laser beam is seen being focused on a link element 25 of a memory circuit.

The spot size is typically 3 to 4 microns in diameter, with peak power occurring in the center of the spot in accordance with a gaussian distribution, and with lower power occurring at the edges.

The link 25 is somewhat smaller than the spot size. A link may be for instance 1 micron wide and about ⅓ micron thick. In the case demonstrated here the link is made of metal.

The metal link is supported on the silicon substrate 30 by silicon dioxide insulator layer 32, which may be, e.g., 0.3–0.5 microns thick. Over the link is another layer of silicon dioxide (not shown). In the link blowing technique the laser beam impinges on the link and heats it to the melting point. During the heating the metal is prevented from vaporizing by the confining effect of the overlying layer of oxide. During the duration of the short pulse, the laser beam progressively heats the metal, until the metal so expands that the insulator material ruptures. At this point, the molten material is under such high pressure that it instantly vaporizes and blows cleanly out through the rupture hole.

For this process to occur, significant pressure in the molten material is required. Over the time that the metal is heating to the melting point and building up pressure, the heat can conduct to other parts of the wafer. By achieving this pressure with a very short pulse, however, we limit the amount of heat conducted into the silicon substrate. Techniques for producing very short pulses are described in Smart, U.S. Pat. No. 4,483,005, the entire disclosure of which is hereby incorporated herein by reference.

Figure 6:
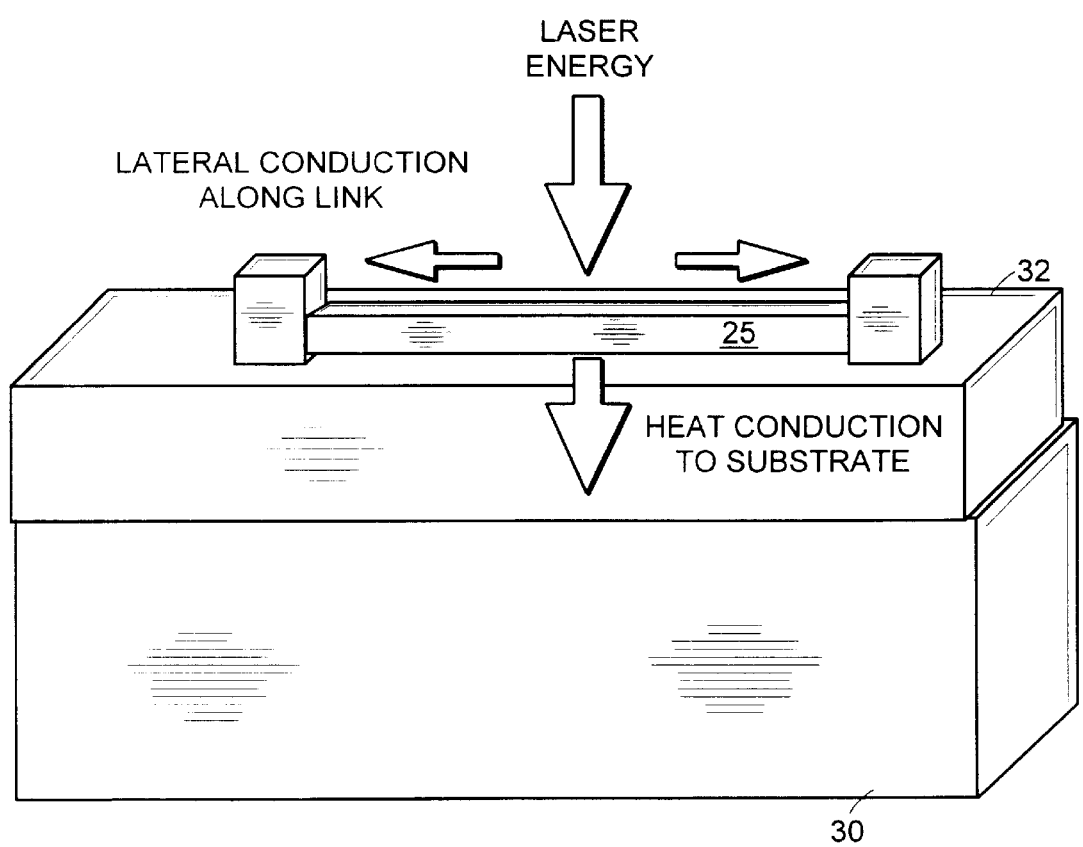
FIG. 6 is a perspective diagrammatic view of a link of a memory on its substrate.

In particular, silicon dioxide layer 32 between silicon substrate 30 and link 25 is about 3000 to 5000 Angstroms (0.3 microns to 0.5 microns) thick. This structure is shown in FIG. 6. The heat is conducted to substrate 30 and along link 25 as shown. The amount of heat that is transferred to substrate 30 through silicon dioxide layer 32 is dependent upon the material characteristics of the oxide (the thermal diffusivity), the thickness of oxide layer 32, and the length of the laser pulse. The calculation of this thermal transfer is quite complex, but a qualitative feel for the effect can be indicated by the formula for temperature T at the interface between oxide layer 32 and silicon substrate 30:

$$T(z,t) = Ts\{1 - \mathrm{erf}[z/2(\kappa t)^{1/2}]\},$$

where $$\mathrm{erf}(x) = \left[2/(\pi)^{\frac{1}{2}}\right] \int_0^x e^{-\zeta^2} \, d\zeta, \text{ and}$$

Figure 7:
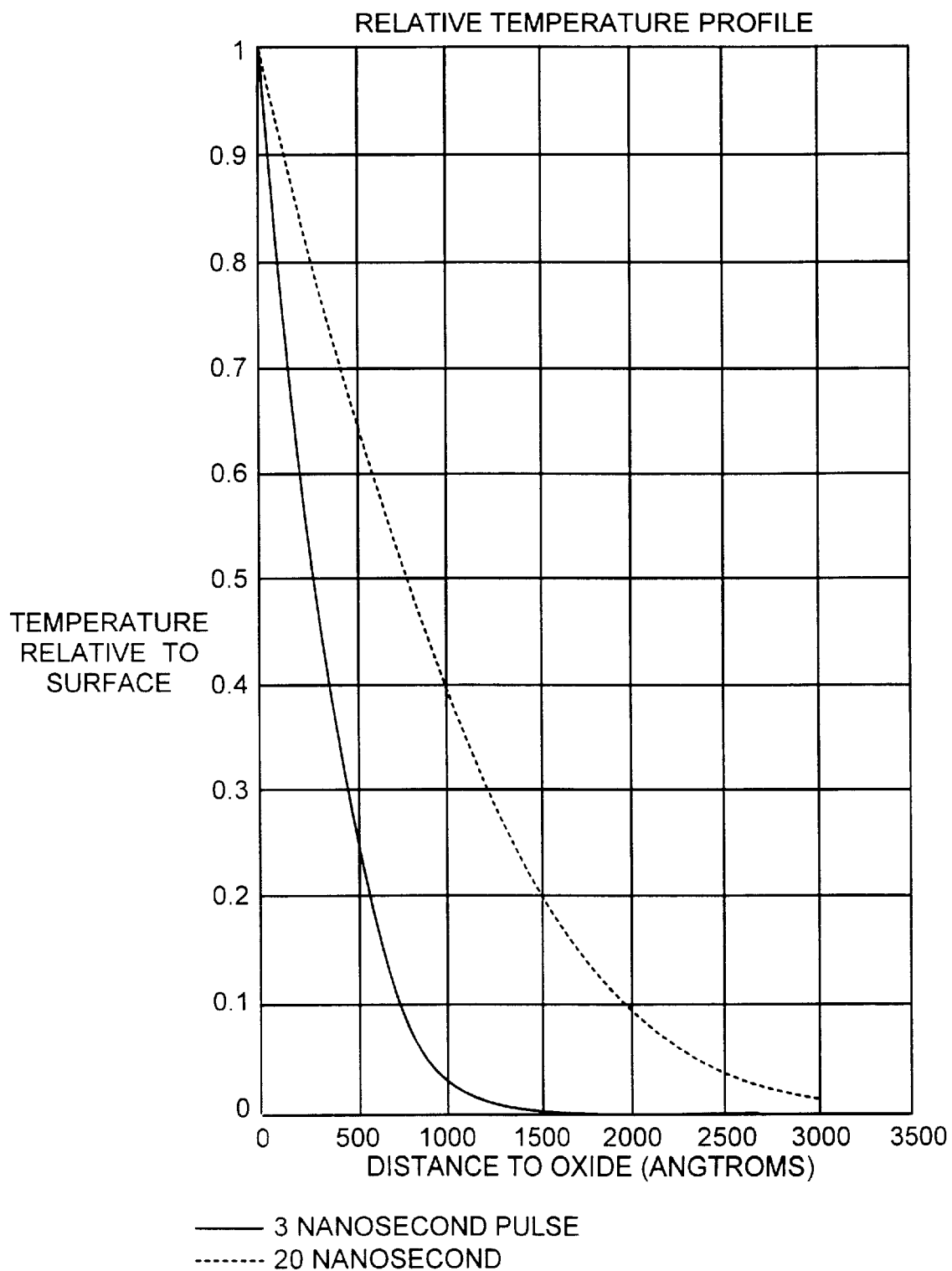
FIG. 7 is a plot of temperature at the interface between the silicon dioxide layer and the silicon substrate in FIG. 6, as a function of the thickness of the silicon dioxide layer.

Ts is the surface temperature, z is the thickness of the layer (for oxide this is 0.3 microns), κ is the thermal diffusivity of the silicon dioxide layer, and t is the length of the laser pulse. T(z,t)/Ts is plotted in FIG. 7 for the silicon dioxide layer for two laser pulse widths of 3 nanoseconds and 20 nanoseconds. The curves in FIG. 7 clearly show that using a shorter pulse width helps in preventing heat from being conducted into the silicon substrate.

Thus, short laser pulses are advantageous in processing high-density memories because the short pulse contains the heating of material to the link area. Short pulses prevent the heat from dissipating into the silicon substrate and adjacent structures, thus causing collateral damage. Hence, it is desirable to use conventional lasers with short laser pulse capabilities.

According to the invention, the silicon substrate is kept relatively cool both by appropriate selection of wavelength and by limiting the pulse duration, with a correspondingly high peak pulse. By selection of the wavelength beyond the absorption edge, but constrained to be less than 1.2 µm, the silicon does not have the capability to absorb very much of the energy, while most of the heat is confined to the link by keeping the pulse short.

By thus limiting the heating, it is possible to ensure that the silicon does not shift its absorption edge into the infrared and enter a thermal runaway condition in which silicon damage can occur.

Figure 8:
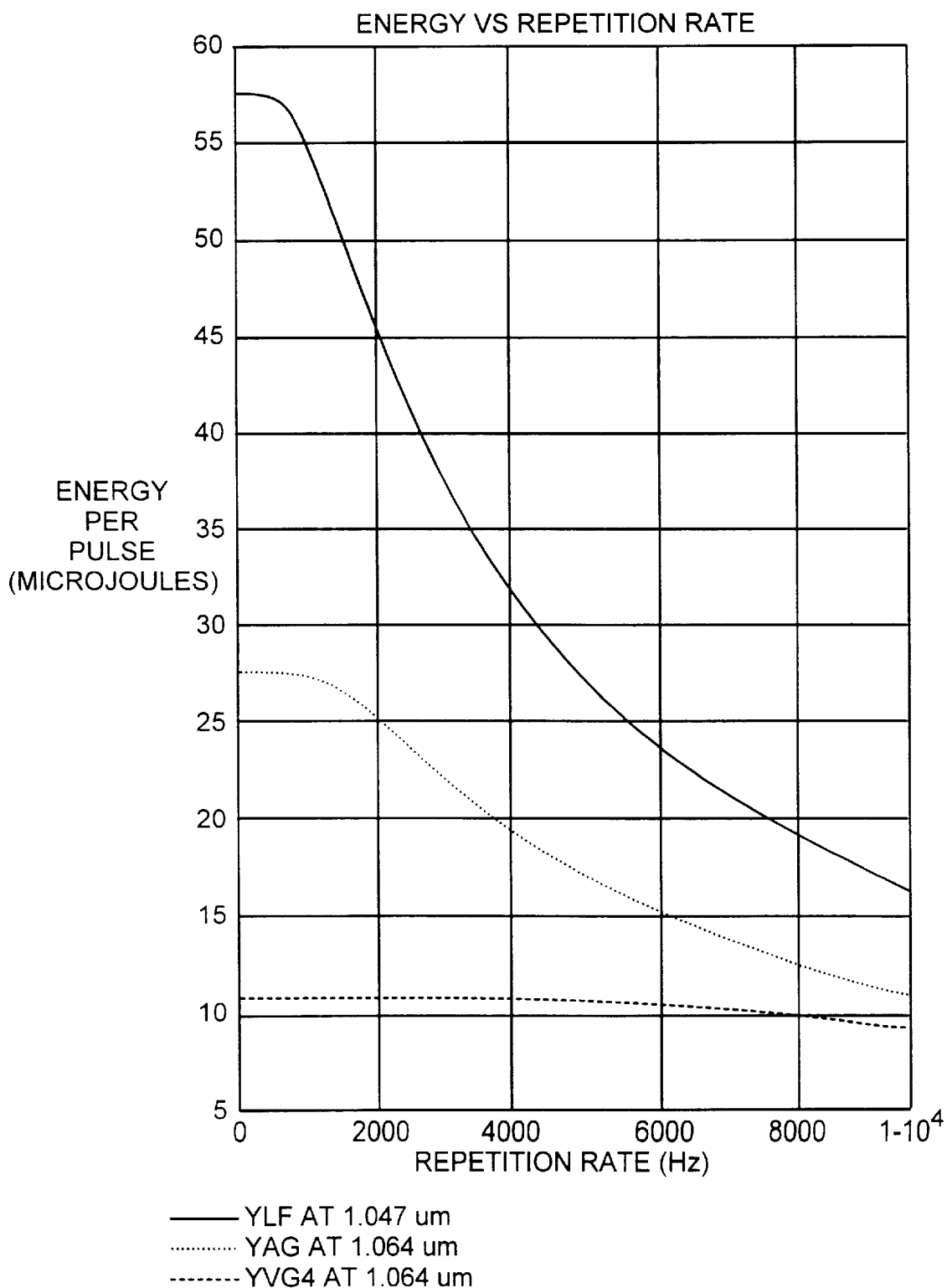
FIG. 8 is a plot of energy per pulse for a neodymium vanadate laser over a range of repetition rates of the pulses.
Figure 9:
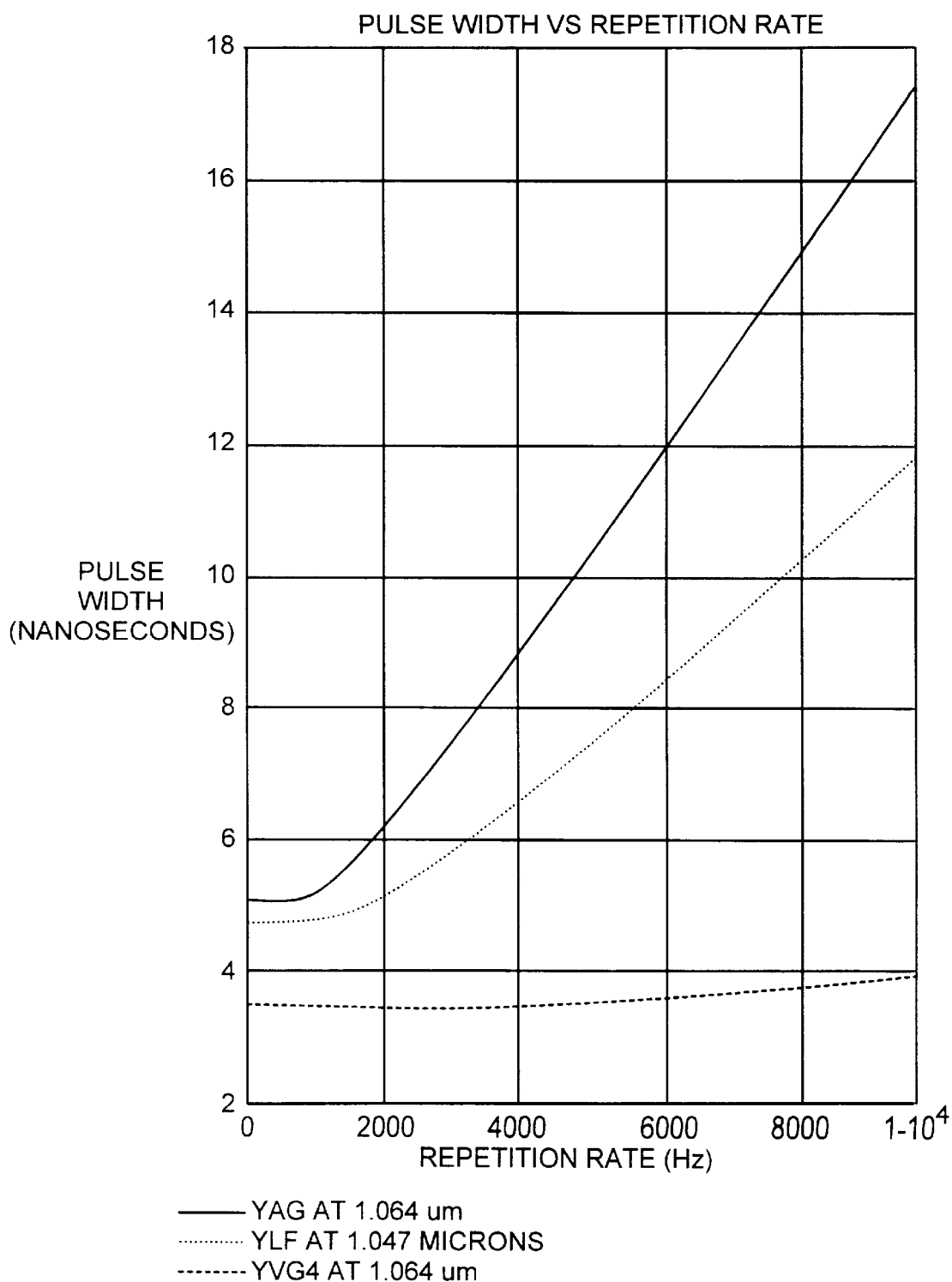
FIG. 9 is a plot of pulse width for a neodymium vanadate laser over a range of repetition rates of the pulses.

In FIGS. 8 and 9 we show a plot of the energy as a function of repetition rate, and also the minimum obtainable pulse width as a function of repetition rate, for the neodymium vanadate laser. As shown in this diagram, the pulse width is short up to about 10 Khz and the energy stays nearly constant up to that level. In most circumstances, it is highly advantageous to operate the laser in the higher repetition rate range to achieve high productivity and speedy handling of the wafer.

This will be more fully understood from the following considerations.

As is well known, a 256 megabit memory device is typically about 10 mm wide and as much as 1.8 cm long. A 256 megabit memory device stores 256 million bits of information. In production, the memories are tested before memory repair is conducted. In memories like this there are rows or columns of elements, with a number of redundant rows. If a bad row is found, it is recorded and is subsequently surgically removed in the manner that has been described, and a spare row is programmed in to the circuit by also removing links to switch transistors.

It is very important to have the number of links removed per second be as high as possible. The bigger memories, such as the 256 megabit memory, have many more links than smaller memories, and hence have more links to be removed. Whereas in the 1 megabit memory, perhaps only 20 links total are removed, in a 256 megabit memory 2,000 or 3,000 links may be removed.

With the present invention a higher throughput of link removal is achievable because higher repetition rates are made possible. Link removal is performed efficiently and with high yield (high probability of successful link removal) because the high-energy pulse is short and therefore blows the link cleanly, while the substrate is not damaged because the amount of total power is limited by the short pulse length and the use of a sightly longer wavelength, just beyond the absorption edge. Thus, high throughput and reliability of the process of removing links is achievable, with low reject rate.

All of these advantages are obtained by a system that is efficient and small in size. Size is important because the system typically must be used in a clean room to keep the semiconductor devices clean. Space in clean rooms is expensive, and so to keep the system small and still do a good job is a considerable advantage. Likewise it is advantageous to avoid water cooling or accessing cooling hoses and the like, to avoid environmental problems, as clean rooms must be temperature controlled to a very high level. The embodiment of FIG. 5 has these advantages as well.

As has been mentioned above, in the embodiment of FIG. 5, a conventional laser 10 with a very short pulse width, designed to maintain this pulse width over a substantial range of laser repetition rates, is introduced into a system that includes a wavelength shifter 12. The conventional laser 10 at 1.064 microns or 1.047 microns typically has a very high gain and can be easily designed to develop the requisite short pulse. A laser configured to intrinsically have the longer wavelength, such as the 1.32-micron wavelength of YAG or YLF, would have intrinsically low gain and hence will have a pulse width much longer than desired. The Nd:VO$_4$ (vanadate) laser 10 has very high gain and constant pulse width at high repetition rates operating at 1.064 microns. The wavelength shifter 12 (such as a stimulated Raman scattering laser) can shift the wavelength to beyond the absorption edge of silicon without increasing the laser pulse width.

For memory repair, the energy per pulse required to remove links is extremely small and can be easily provided by any of the laser types to be discussed. What is important in memory repair in accordance with the present invention is a short laser pulse. In the following discussion we explain why a laser operated at a standard wavelength can produce pulses shorter than can be produced by the same laser operated at a longer wavelength. In particular, we will derive some approximate formulas for laser design and use these formulas to compare different laser materials and wavelengths to show why minimum pulse width increases with wavelength. In order to accomplish this we first examine two characteristics of a laser upon which its minimum pulse width depends: single pass gain and optimum output coupler.

The single pass gain of the laser is an important performance parameter of a laser. For a laser to oscillate, the optical power gain must be greater than the losses within the cavity. In fact, the laser threshold is defined as the point at which the optical gain is equal to the losses. For a Q-switched laser, the pulse width is dependent upon the length of the cavity, the transmission of the output coupler (the front mirror), and the magnitude of the gain over its threshold level.

Let us examine the laser aspects that make up the single pass gain. It is dependent upon the power density of the light source used to "pump" the laser, the efficiency of conversion of this power to useful laser output, and the material characteristics of the lasing medium. The relationship is given as follows:

$$\text{Gain}=EP/[I_{sat}(A_{pump}+A_{mode})]$$

where n is the efficiency of conversion of pump light to laser output, P is the pump power (i.e., the effective power delivered by the laser diode), $I_{sat}$ is a material parameter dependent on the laser material and its doping, $A_{pump}$ is the cross-sectional area covered by the pump beam in the laser rod, and $A_{mode}$ is the cross-sectional area of the laser mode within the laser rod.

Except for $I_{sat}$, the gain is dependent on laser system design. For the Light Wave Electronics laser, Model 110, the pump efficiency E is about 25 percent, the effective pump power used P is 0.7 watts, the pump area $A_{pump}$ is 0.46 square millimeters, and the laser mode crosssectional area $A_{mode}$ is 0.015 square millimeters.

$I_{sat}$, the material-dependent parameter, relates to the storage time capabilities of the laser material and its "lasing cross section for stimulated emission." The higher the cross section, the higher the gain. This material-dependent parameter is given by:

$$I_{sat}=hv/\sigma\tau$$

where h is Planck's constant, v is the frequency of light (the speed of light c divided by the lasing wavelength λ), σ is the cross section for stimulated emission, and τ is the energy storage time or "the upper state lifetime."

The values of σ, τ, $I_{sat}$, and single-pass gain for the typical laser materials are given in the table of FIG. 10. This table shows that at the 1.32-micron wavelength for YAG and YLF lasers the single-pass gain is much less than at 1.064 and 1.047 microns. Preferably, the single-pass gain should be about 20 percent or greater, and the fluorescent lifetime should be less than about 100 microseconds Another important system parameter that needs to be chosen in laser system design is the optimum output coupler. This is directly dependent on the gain and losses within the laser cavity. The transmission of the output coupler is given as follows:

$$T_{optimum} = 2[(gain \times loss)^{1/2} - loss].$$

For the Light Wave Electronics Model 110 laser the single-pass loss is approximately 0.66 percent. The gain, as has been previously mentioned, is dependent on the laser material. The output couplers for various materials are shown in the table of FIG. 11. Preferably the optimum output coupler should be greater than 5 percent.

With the establishment of the laser system parameters (gain and output coupler transmission), the duration of the Q-switched pulse (laser pulse width) can be calculated. The Q-switched pulse width is a multiple of the cavity decay time $t_c$, which is defined as the time taken for 63 percent of the light in the laser resonator to exit from the mirror of the laser. This time is given by:

$$t_c = 2Ln/cT$$

where L is the cavity length (20 mm for the Light Wave Model 110 laser), T is the transmission of the output coupler, c is the speed of light, and n is the average index of refraction of the laser cavity (assumed to be 1.48). Knowing the ratio of stored energy versus threshold energy, one can calculate the laser pulse width as follows:

$$\tau_p = \{r^n(r)/[r - 1 - \ln(r)]\} \times \tau_c$$

where $\tau_p$ is the laser pulse width, r is the initial ratio of the energy stored in the cavity versus the threshold energy (this is the round trip gain (2×single-pass gain)/mirror transmission), and $^n(r)$ is the efficiency of the Q switch in extracting the stored energy ($^n(r)$ is 1 for r≧2). The pulse widths for various materials and wavelengths are shown in the table of FIG. 12.

The above calculations from which we derive the laser pulse width $\tau_p$ assume that the laser stores the maximum energy that can be stored in the laser. This assumes that the repetition rate of the laser is very low, i.e., that there is enough time between pulses to allow the rod of the laser to come to the maximum storage level. This time is much greater than the "upper state lifetime" τ that is characteristic of the laser material, which is the time it takes to allow the rod of the laser to come to 63 percent of the maximum storage level. We now describe how the laser pulse width $\tau_p$ varies with respect to the repetition rate at which the laser operates.

The maximum energy that can be delivered by a laser is a function of the maximum laser power and the storage time (the "upper state lifetime"), and is given by:

$$E_{max} = P_{cw} \tau$$

where $E_{max}$ is the maximum energy that can be extracted from the laser, $P_{cw}$ is the maximum average power of the laser, and τ is the storage time or "upper state lifetime." Once $E_{max}$ and the laser pulse width $\tau_p$ are determined, then one can calculate the energy per pulse E and the pulse width $T_p$ at any other repetition rate using the following approximations:

$$E = E_{max}[1 - \exp(-t/\tau)];$$
$$T_p = \tau_p/[1 - \exp(-t/\tau)],$$

where t is the time between laser pulses (the inverse of the repetition rate).

With the above equations, knowing the system parameters and material constants, one can calculate the energy per pulse and the laser pulse widths for various repetition rates and wavelengths. Plots are given in FIGS. 8 and 9. It is generally preferred that the pulse width be substantially flat with respect to repetition rate, i.e., that it should vary no more than about 25 percent from zero to 10 kilohertz.

From the plot in FIG. 8 one can see that the longer storage time of the YLF laser yields much higher energy per pulse but has the most change in energy as a function of repetition rate. On the other hand, the vanadate laser has the lowest energy per pulse but has relatively less drop off as a function of repetition rate. For memory repair, the vanadate characteristics of energy versus repetition rate are much more desirable. Since the upper state storage time for 1.32 microns is similar to the 1.047 and 1.064 micron levels, the energy versus repetition rate is about the same.

FIG. 9 shows the repetition rate for the three different materials as a function of repetition rate. Not only does the $YVO_4$ (vanadate) have the shortest pulse width, but it maintains this pulse width over a very wide range.

Figure 13:
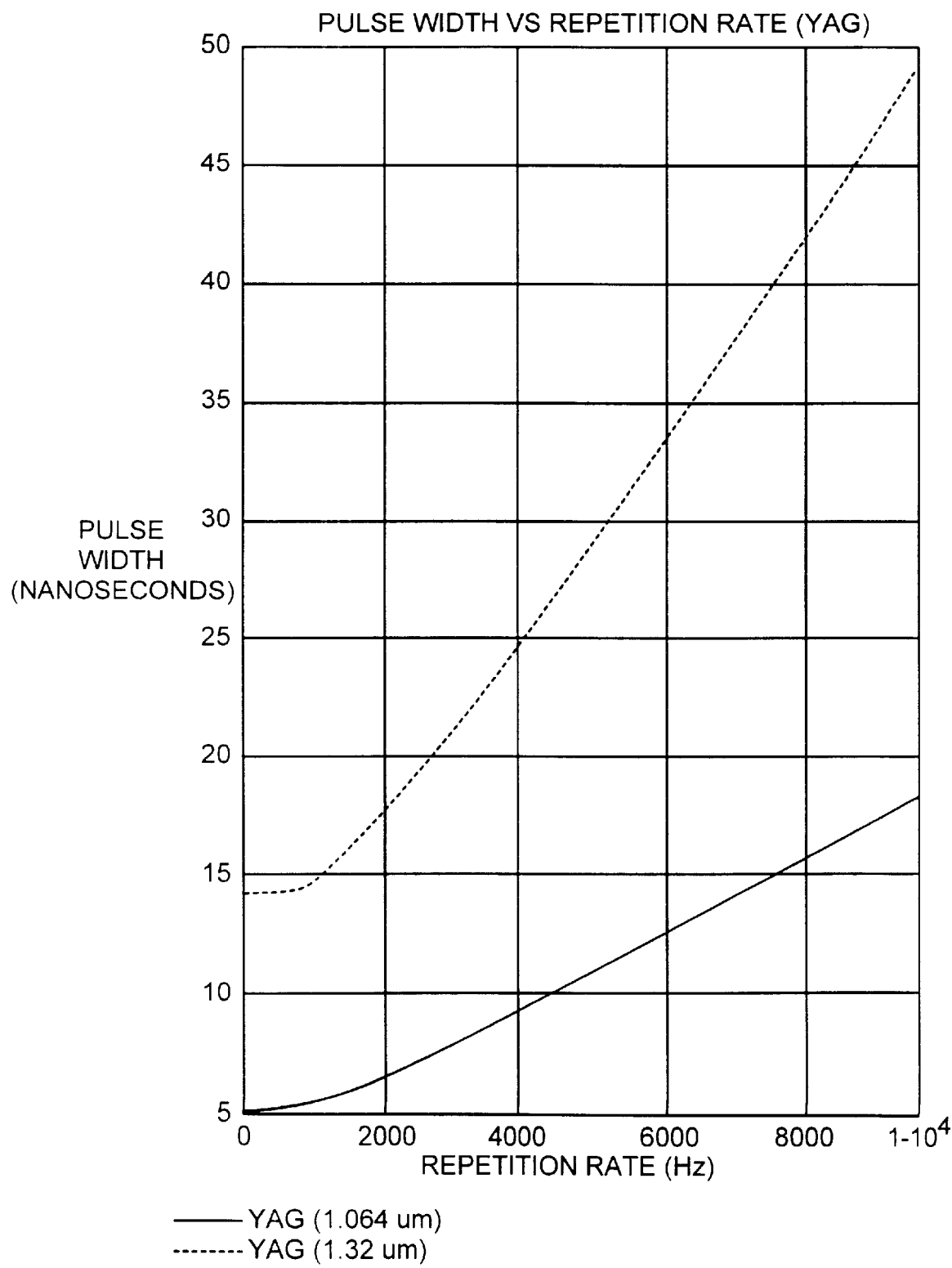
FIGS. 13–15 are plots of pulse widths of different materials at shorter wavelengths (1.047 microns and 1.064 microns) and longer wavelengths (1.32 microns and 1.34 microns).
Figure 14:
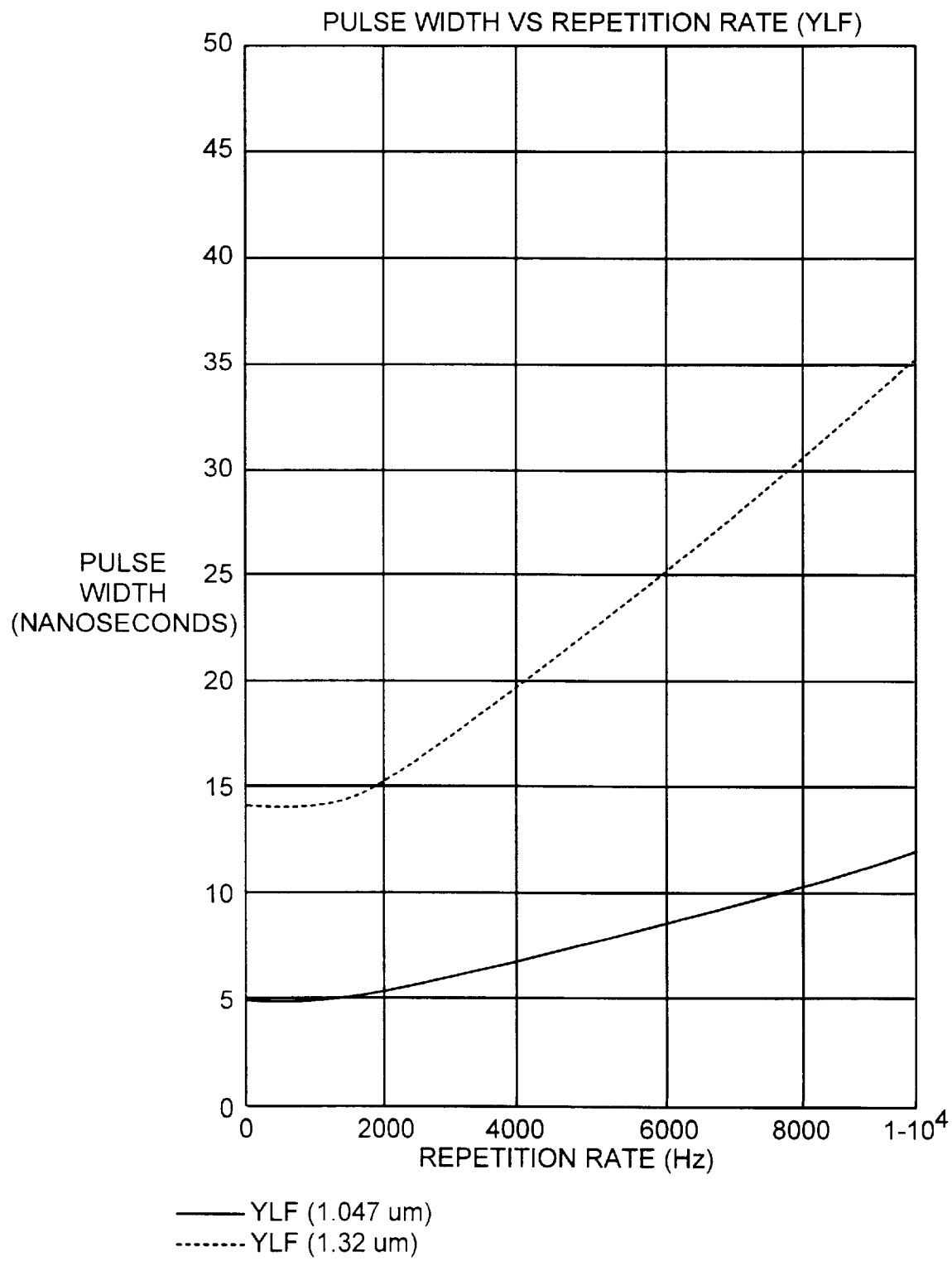
Figure 15:
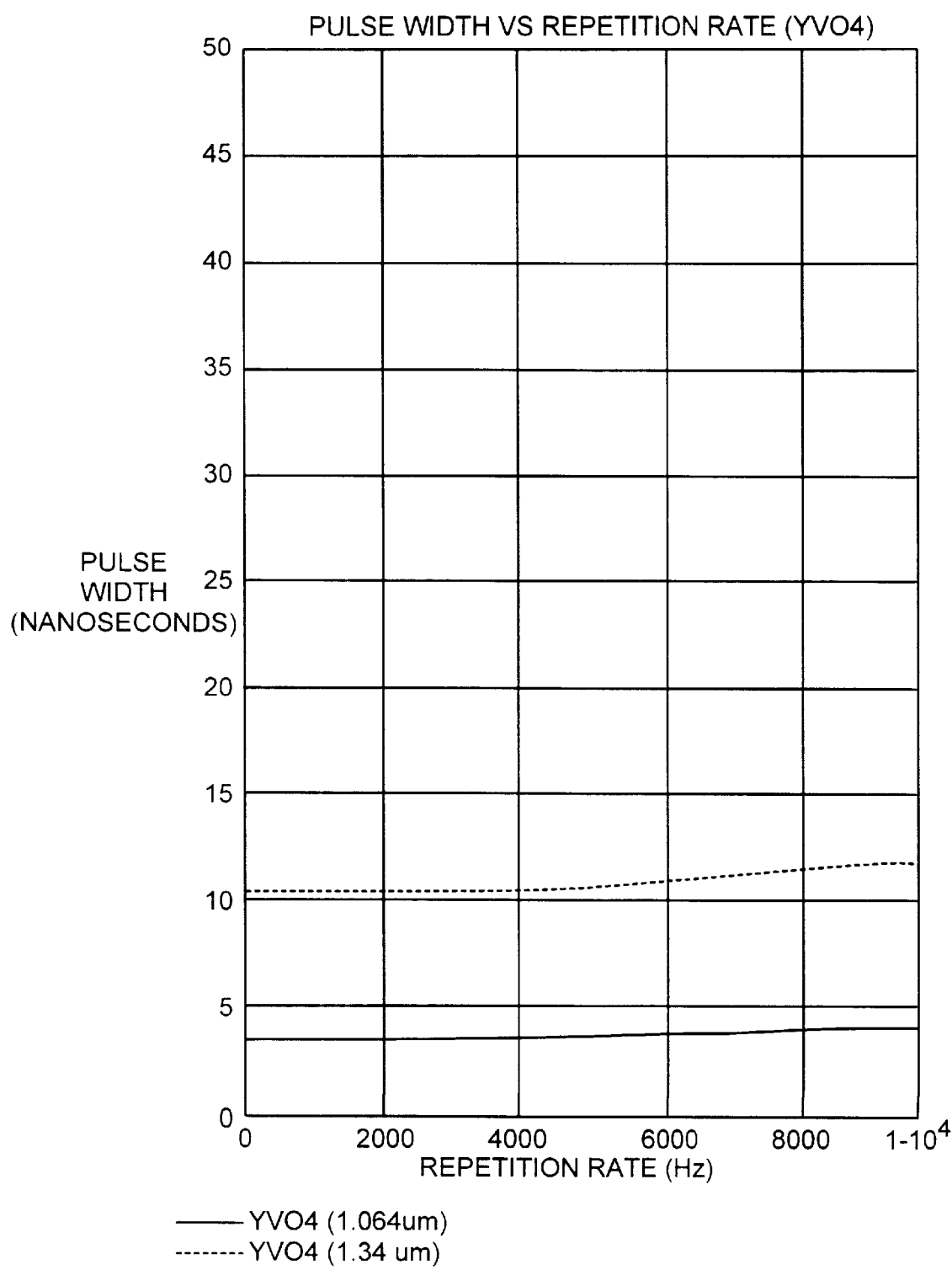

FIGS. 13, 14, and 15 compare the pulse widths of different materials at the shorter wavelengths (1.047 microns and 1.064 microns) with the longer wavelengths at 1.32 microns and 1.34 microns. In these graphs the pulse width is very much affected by going to the longer wavelengths.

Referring again to FIG. 5, in order to achieve the shortest possible pulses at longer wavelengths it is proposed that a shorter-wavelength laser 10 be used and that the wavelength be shifted as required by using a stimulated Raman scattering (SRS) laser as the wavelength shifter 12. This SRS laser 12 is predicted to have a 50 percent efficiency in energy conversion, and the laser pulse width produced by SRS laser 12 will be the same as or a little shorter than the laser pulse width produced by conventional laser 10. SRS laser 12 has the additional advantage of shifting to a wavelength somewhat shorter than the 1.32 micron and 1.34 micron wavelengths produced by YAG, YLF, or $YVO_4$ lasers.

The vanadate laser ($YVO_4$) has the best performance as conventional laser 10 because it provides the shortest laser pulse and maintains this short pulse over the required pulse repetition rate. A short-pulse $YVO_4$ laser 10 operating at 1.064 microns wavelength, shifted to 1.198 microns by wavelength shifter 12, is the laser of choice. The stimulated raman scattering laser 12 shifts the 1.064-micron wavelength to beyond the absorption edge of silicon, and so improves the memory repair process.

FIG. 5 shows wavelength shifter 12 in place. The shifter is constructed to be removable and the system made operable without it in place.

Semiconductor memory facilities usually employ a number or processes that have been established over a period of time. For example a 1 megabit memory may be produced one day, which has polysilicon links, which are removed efficiently using the standard wavelength of 1.064 μm. The next day a newer device may be produced which has metal links and are advantageously removed by the system just described.

Figure 17:
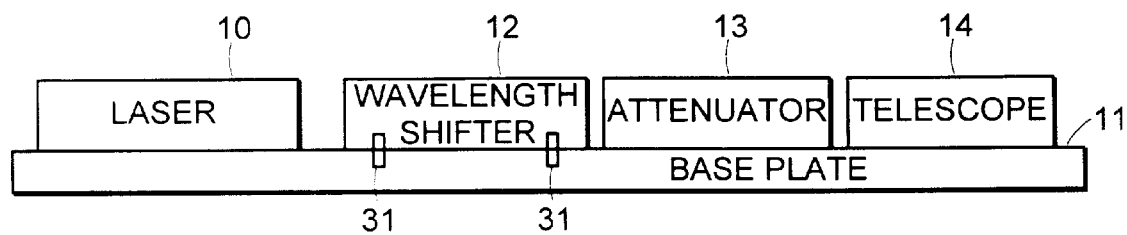
FIG. 17 is a side view of the system of FIG. 16 showing the replaceable addition of a wavelength shifter to achieve the system of FIG. 5.

In a practical system, the shifter is constructed to be moved in and out of the beam line. For this purpose, the shifter is pre-aligned and accurately point pinned by pins 31 into the stable structural base plate 11 of the laser system (see FIG. 17). When shifter 12 is removed from its pins, everything else (i.e., the laser, the system switch 13, etc.) remains properly aligned so that only recalibration is required.

Figure 16:
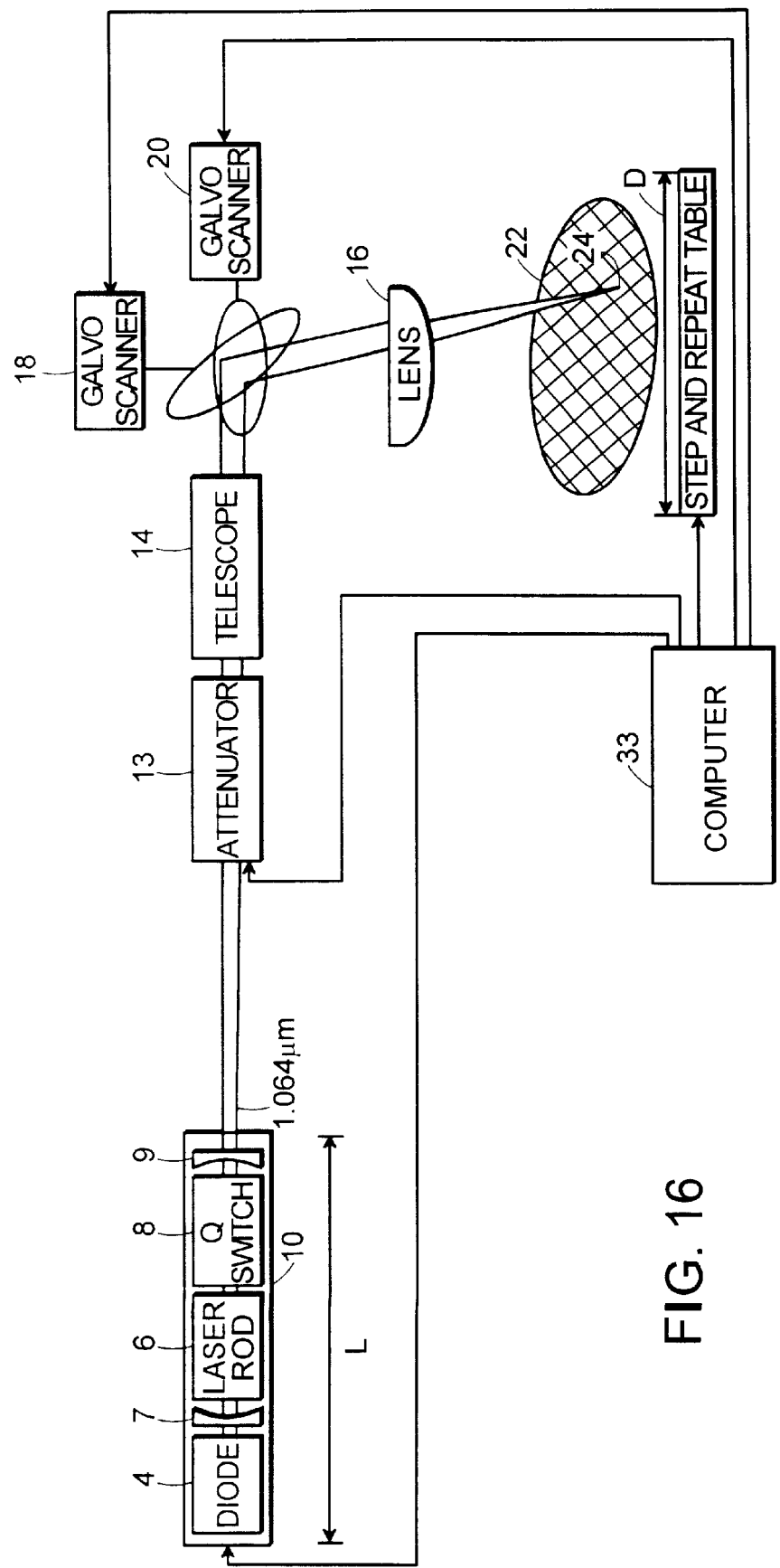
FIG. 16 is a block diagram similar to FIG. 5, operating at 1.064 μm.

FIG. 16 shows the system of FIG. 5 with the shifter removed for removing links using a treatment beam of 1.064 μm. To operate at the longer wavelength, the shifter is replaced in its pins and no realignment is required.

Figure 18:
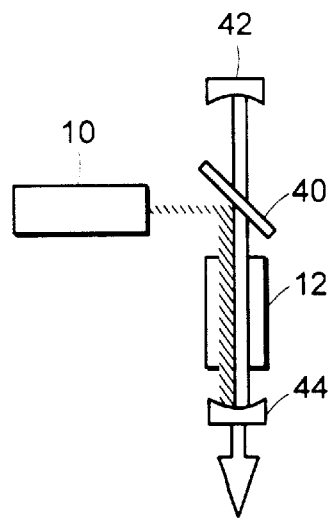
FIG. 18 is a drawing of a neodynium vanadate laser and a barium nitrate Raman wavelength shifter.

As mentioned, the invention can be implemented using neodymium vanadate lasers and using a removable solid-state, stimulated Raman scatter shifter. Barium nitrate Raman shifters appear to be especially useful because they have a high damage threshold (they are not easily damaged by high-density laser beams). One particular implementation of a barium nitrate Raman shifter is shown in FIG. 18. Vanadate laser 10 produces a light beam that impinges on dichroic mirror 40, which is highly reflective at 1.064 microns but highly transmissive at 1.198 microns. The 1.064-micron wavelength light from laser 10 is reflected into barium nitrate wavelength shifter 12, which shifts wavelength of the light to 1.198 microns. The 1.198-micron wavelength light is reflected between mirror 42, which is highly reflective at 1.198 microns, and mirror 44, which is 50-percent reflective at 1.198 microns (in order to let some of the 1.198-micron wavelength light escape as the output of wavelength shifter 12). Mirrors 44 and 40 are both highly reflective at 1.064 microns, and so any 1.064-micron light is reflected back into vanadate laser 10.

Alternatively, Raman shifter 12 could be incorporated into laser 10 (i.e., laser 10 could be a Raman-shifted laser).

Other shifters may be employed. For example, parametric oscillators may be used which are of fixed wavelengths, that use 2 or 3 crystals at the same time. Under certain circumstances, tunable lasers are operable. Fosterite lasers have a tunable region that essentially straddles the absorption edge region of silicon, and can permit operation both beyond and below the absorption edge of silicon. At the present state of the art, they do not appear to be as efficient as they may become in time. As materials and improvements are being continually developed in the laser field, it is within the invention to use such devices and obtain benefits according to certain of the broad aspects of the present invention.

In summary:

1) Short pulse laser operation is desirable for thin metal and polysilicon links because short pulses limit the time of heat dissipation to surrounding structures, especially the silicon substrate.

2) To increase the process throughput it is desirable to maintain short pulses at high pulse repetition rates. This requires high-gain laser systems, necessitating operation of the laser at the shorter wavelengths. For conventional laser systems these wavelengths are the range of 1.047 microns to 1.064 microns.

3) It is desirable to operate the laser at a laser wavelength slightly beyond the absorption edge of silicon. Operation at the longer wavelengths limits the heating of the substrate that causes damage at high input energies. However, it is advantageous to operate the laser as close to the absorption edge as possible in order to minimize the spot size and maximize the depth of focus of the spot.

At the present state of the laser art the best fit to the above criteria appears to be to operate a high-gain laser (vanadate, for example) at a conventional wavelength. These lasers run below the absorption edge of the silicon substrate. It is desirable to shift the wavelength to beyond the absorption edge with a wavelength shifter such as a stimulated Raman scattering laser. This technique produces the best solution for memory repair—a short-pulse, long-wavelength laser system.

There have been described novel and improved apparatus and techniques for laser processing. It is evident that those skilled in the art may now make numerous uses and modifications of and departures from the specific embodiment described herein without departing from the inventive concept.

What is claimed is:

1. A controlled, switched laser system for vaporizing and removing a target link structure on a silicon substrate, comprising:

a diode-pumped, solid-state laser;

a controllable switch for controlling the on/off state and power level of the laser;

a computer programmed to control the solid-state laser to cause the solid-state laser to produce a laser beam output having an output pulse width less than 8 nanoseconds at an operating repetition rate of 5 kilohertz or higher, the computer being programmed to cause the laser beam output to be directed at the target link structure on the silicon substrate to vaporize and remove the target link structure; and a wavelength shifter for shifting the wavelength of the laser output from a wavelength that is not beyond the absorption edge of the silicon substrate to a wavelength beyond the absorption edge of the silicon substrate but shorter than 1.2 μm in order to obtain a decrease in absorption of the laser output by the substrate due to the shift in the wavelength of the laser output, whereby heating of the silicon substrate and hence damage to the silicon substrate is limited due to the wavelength remaining beyond the absorption edge of the silicon substrate.

2. A controlled, switched laser system for vaporizing and removing a target link structure on a silicon substrate, comprising:

a diode-pumped, solid-state laser;

a controllable switch for controlling the on/off state and power level of the laser; a computer programmed to control the solid-state laser to cause the solid-state laser to produce a laser beam output having an output pulse width less than 8 nanoseconds at an operating repetition rate of 5 kilohertz or higher; and a wavelength shifter for shifting the wavelength of the laser output from a wavelength that is not beyond the absorption edge of the silicon substrate to a wavelength beyond the absorption edge of the silicon substrate but shorter than 1.2 μm in order to obtain a decrease in absorption of the laser output by the silicon substrate due to the shift in the wavelength of the laser output, the wavelength shifter enabling the switched laser system to operate at the wavelength that is not beyond the absorption edge of the silicon substrate and at the wavelength beyond the absorption edge of the silicon substrate but shorter than 1.2 μm;

the laser comprising optics for focusing a laser spot at the wavelength that is not beyond the absorption edge of the silicon substrate and also, without modification of the optics, at the wavelength beyond the absorption edge of the silicon substrate;

the computer being programmed to cause the laser beam output to be directed at a target link structure on a silicon substrate to vaporize and remove the target link structure, the laser output remaining at a wavelength beyond the absorption edge of the silicon substrate but shorter than 1.2 $\mu$m, whereby heating of the first, silicon substrate and hence damage to the silicon substrate is limited due to the wavelength remaining beyond the absorption edge of the silicon substrate.

3. A controlled, switched laser system for vaporizing and removing a target link structure on a silicon substrate, comprising:

a diode-pumped, solid-state laser for producing a laser output;

a controllable switch for controlling the on/off state and power level of the laser;

a wavelength shifter for shifting the wavelength of the laser output from a first wavelength that is not beyond the absorption edge of the silicon substrate to a second wavelength beyond the absorption edge of the silicon substrate but shorter than 1.2 $\mu$m in order to obtain a decrease in absorption of the laser output by the silicon substrate due to the shift in the wavelength of the laser output, the wavelength shifter being removably insertable into the switched laser system so as to enable the switched laser system to operate at the wavelength that is not beyond the absorption edge of the silicon substrate and at the wavelength beyond the absorption edge of the silicon substrate; and a computer programmed to control the solid-state laser to cause the solid-state laser to produce a laser beam output having an output pulse width less than 8 nanoseconds at an operating repetition rate of 5 kilohertz or higher, and a wavelength shorter than 1.2 $\mu$m, the computer being programmed to cause the laser beam output to be directed at the target link structure on the silicon substrate to vaporize and remove the target link structure; and whereby heating of the silicon substrate and hence damage to the silicon substrate is limited due to the second wavelength being beyond the absorption edge of the silicon substrate, and whereby good depth of focus of the laser beam output is maintained relative to spot size of the laser beam output due to the second wavelength being less than 1.2 $\mu$m.

4. A controlled, switched laser system for vaporizing and removing a target link structure on a silicon substrate, comprising:

a diode-pumped, solid-state laser assembly;

a controllable switch for controlling the on/off state and power level of the laser assembly; and a computer programmed to control the laser assembly to cause the laser assembly to produce a laser beam output having an output pulse width less than 5 nanoseconds at an operating repetition rate of 5 kilohertz or higher, and a wavelength shorter than 1.2 $\mu$m, the computer being programmed to cause the laser beam output to be directed at the target link structure on the silicon substrate to vaporize and remove the target link structure;

whereby heating of the silicon substrate and hence damage to the silicon substrate is limited due to the output pulse width being less than 5 nanoseconds.

5. The laser system of claim 4 wherein the output pulse width of the laser beam output is less than 5 nanoseconds at an operating repetition rate of 8 kilohertz or higher.

6. The laser system of claim 4 wherein the output pulse width of the laser beam output is less than 4 nanoseconds at an operating repetition rate of 5 kilohertz or higher.

7. The laser system of claim 4 wherein the output pulse width of the laser beam output is less than 4 nanoseconds at an operating repetition rate of 8 kilohertz or higher.

8. The laser system of claim 4 wherein the output pulse width of the laser beam output is less than 5 nanoseconds at an operating repetition rate of 10 kilohertz or higher.

9. The laser system of claim 4 wherein the output pulse has a peak beam power sufficiently high to evaporate a metal link in a high-density memory.

10. The laser system of claim 4 wherein the laser assembly comprises a neodymium vanadate laser.

11. The laser system of claim 4 wherein the laser assembly comprises a neodymium:YLF laser.

12. The laser system of claim 4 wherein the laser assembly comprises a neodymium:YAG laser.

13. The laser system of claim 4 wherein the laser assembly comprises a laser having a cavity length optimized for limiting the output pulse width.

14. The laser system of claim 4 wherein good depth of focus of the laser beam output is maintained relative to spot size of the laser beam output due to the wavelength being less than 1.2 $\mu$m.

15. A method of vaporizing and removing a target link structure on a silicon substrate, comprising the steps of:

providing a controlled, switched laser system comprising a diode-pumped, solid-state laser assembly and a controllable switch for controlling the on/off state and power level of the laser assembly;

producing a laser beam output having an output pulse width less than 5 nanoseconds at an operating repetition rate of 5 kilohertz or higher, and a wavelength shorter than 1.2 $\mu$m; and directing the laser beam output at the target link structure on the silicon substrate to vaporize and remove the target link structure;

whereby heating of the silicon substrate and hence damage to the silicon substrate is limited due to the output pulse width being less than 5 nanoseconds.

16. The method of claim 15 wherein the output pulse width of the laser beam output is less than 5 nanoseconds at an operating repetition rate of 8 kilohertz or higher.

17. The method of claim 15 wherein the output pulse width of the laser beam output is less than 4 nanoseconds at an operating repetition rate of 5 kilohertz or higher.

18. The method of claim 15 wherein the output pulse width of the laser beam output is less than 4 nanoseconds at an operating repetition rate of 8 kilohertz or higher.

19. The method of claim 15 wherein the output pulse width of the laser beam output is less than 5 nanoseconds at an operating repetition rate of 10 kilohertz or higher.

20. The method of claim 15 wherein the target structure comprises a metal link in a high-density memory.

21. The method of claim 15 wherein the second target structure comprises a link formed of a material selected from the group of polysilicide and polysilicon.

22. The method of claim 15 wherein good depth of focus of the laser beam output is maintained relative to spot size of the laser beam output due to the wavelength being less than 1.2 µm.

23. The method of claim 15 wherein the laser beam output has a spot size and depth of field sufficient for reliable processing of target structures on a substrate having a substantially non-flat surface.

24. The method of claim 68 wherein the laser beam output has a spot size and depth of field sufficient for reliable processing of target structures on a wafer having approximately an 8-inch diameter, a thickness of less than about 300 µm, and a substantial variation in flatness over its surface.

25. The method of claim 15 wherein the target structure vaporized by the laser beam output is about 1 µm wide.

26. The method of claim 15 wherein the target structure vaporized by the laser beam output is about ⅓ µm thick.

* * * * *